United States Patent [19]

Yamashiro

[11] 4,309,665

[45] Jan. 5, 1982

[54] COMPLEMENTARY AMPLIFIER CIRCUIT

[75] Inventor: Osamu Yamashiro, Ohmiya, Japan

[73] Assignee: Hitachi, Ltd., Tokyo, Japan

[21] Appl. No.: 119,510

[22] Filed: Feb. 7, 1980

[30] Foreign Application Priority Data

Mar. 28, 1979 [JP] Japan ................... 54-35469

[51] Int. Cl.$^3$ ........................ H03F 3/185; H03B 5/36
[52] U.S. Cl. .......................... 330/264; 331/116 FE; 330/288
[58] Field of Search ................... 330/264, 288; 331/116 FE

[56] References Cited

U.S. PATENT DOCUMENTS 4,100,502  7/1978  Yamashiro .................... 330/264

Primary Examiner—James B. Mullins
Assistant Examiner—Gene Wan
Attorney, Agent, or Firm—Craig and Antonelli

[57] ABSTRACT

A complementary amplifier circuit includes a p-channel MISFET and an n-channel MIS connected in series. The gate of the p-channel FET transistor is D.C. biased by a high impedance resistor connected between the gate and drain electrodes, and the gate of the n-channel FET is D.C. biased by a current mirror circuit formed by another n-channel FET. This complementary amplifier circuit has the advantages that the operational lower limit voltage thereof is equal to the threshold voltage of one of the MOSFETs and that stabilized operation of the amplifier is easily obtained.

8 Claims, 3 Drawing Figures

COMPLEMENTARY AMPLIFIER CIRCUIT

BACKGROUND OF THE INVENTION

1. Field of the Invention

This invention relates to a complementary amplifier circuit and, more particularly, to a complementary metal-insulator-semiconductor (C-MIS) amplifier circuit comprising a p-channel metal-insulator-semiconductor field effect transistor (referred to as a MISFET or simply as a FET) and an n-channel MISFET.

2. Description of the Prior Art

Complementary field effect transistor amplifier circuits are widely used in electronic circuits, such as an oscillator for an electronic wrist watch. Such a circuit is characterized, for example, by high threshold levels, inherent structural simplicity and low power consumption.

Various types of improved circuits which enjoy the low power characteristics of the complementary FET amplifier have been proposed. For instance, as will be described later, it is possible to connect, through a bias resistor, the gate and drain of each MISFET constituting the complementary amplifier to each other to equalize the gate potential and the drain potential and, at the same time, to connect the drains of two FETs through a load resistor to effect class B operation to reduce the through current and, hence, the power consumption. This type of amplifier circuit is disclosed in the specification of U.S. Pat. No. 4,100,502, entitled "Class B FET Amplifier Circuit" and granted to Osamu Yamashiro. This amplifier circuit, however, requires an operating voltage which is at least equal to or higher than the sum of the threshold voltages of the two MISFETs constituting the complementary amplifier circuit.

In order that a MIS amplifier circuit may operate with an operating voltage which is only higher than the threshold voltage of each of the MISFETs constituting the amplifier circuit, the specification of U.S. Pat. No. 3,887,881 to Kurt Hoffmann entitled "Low Voltage C MOS Amplifier" discloses an amplifier circuit in which two potential divider circuits to each of which a MISFET is connected in series, are connected in parallel with a C-MIS amplifier circuit, the output from the potential divider circuit being applied to the gates of the FETs constituting a C-MOS amplifier. In this amplifier, however, the operating voltage fluctuates undesirably and unstable operation of the amplifier is often caused by fluctuation in the characteristics of the circuit constituents, because the gates of the MOSFETs constituting the C-MOS amplifier circuit are fixedly biased.

SUMMARY OF THE INVENTION

It is therefore an object of the present invention to provide a C-MIS amplifier circuit having a low operational lower limit voltage requirement and which is capable of providing stable amplification even if the operating voltage fluctuates.

It is another object of the invention to provide a C-MIS amplifier circuit having a reduced power consumption.

It is still another object of the invention to provide a C-MIS amplifier which can easily be combined with ordinary elements constituting an oscillator, such as a capacitor and a quartz oscillator, particularly suitable for use in wrist watches.

To these ends, according to the invention, there is provided a complementary MIS amplifier circuit which has, in a broader sense, a MISFET of first conductivity type provided with a self-bias resistor, and a MISFET of second conductivity type which is biased by means of a current mirror circuit.

More specifically, the complementary MIS amplifier circuit of the invention has a first MISFET provided with a bias resistor connected between its gate and drain, a second MISFET having its drain connected to the drain of the first MISFET, a third MISFET having a gate and a drain connected to the gate of the second MISFET, and load means adapted to supply the third FET with electric current, the gates of the first and second FETs being adapted to receive input signals which are separated from each other in a D.C. manner.

In the C-MIS amplifier circuit of the invention, the first MISFET is D.C. biased to its threshold voltage by the bias resistor, while the second MISFET is D.C. biased to its threshold voltage by the third MISFET. In addition, the gates of the first and second MISFETs are adapted to receive A.C. input signals which are separated from each other in a D.C. sense. Therefore, even if the source voltage (operating voltage) applied between the sources of the first and the second MISFETs fluctuates, the amplifier circuit performs correct and stable amplification as long as the operating voltage is maintained at a level higher than the higher one of the threshold voltages of the first and the second MISFETs. Also, since class B operation is effected, the level at which the first and second complementary MISFETs become conductive simultaneously against an A.C. signal amplitude is minimized to reduce the power consumption.

These and other objects, features and advantages of the present invention will become more apparent from the following detailed description of the invention when taken in conjunction with the accompanying drawings.

DESCRIPTION OF THE PREFERRED EMBODIMENTS

Figure 1:
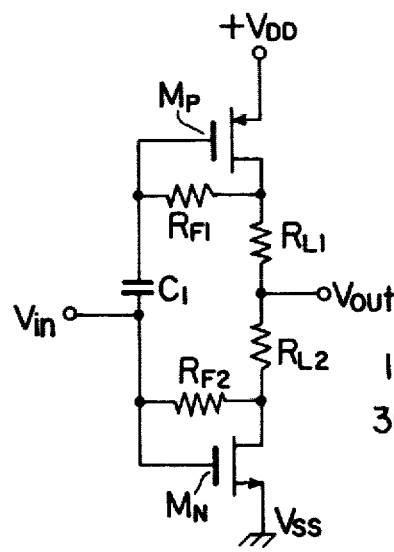
FIG. 1 is a schematic circuit diagram of a conventional complemenary amplifier circuit.

In a conventional complementary FET amplifier, which is described in the aforementioned U.S. Pat. No. 4,100,502 and shown in FIG. 1, a p-channel FET $M_p$ connected to a potential source $+V_{DD}$ and an n-channel FET $M_n$ connected to a different potential source $V_{SS}$ (ground) are connected in a series fashion to form a complementary amplifier. Here, between the complementary FETS Mn and Mp, two load resistors $R_{L1}$ and $R_{L2}$ of equivalent resistance are connected in series. Further, biasing resistors $R_{F1}$ and $R_{F2}$ are connected for the FETs $M_p$ and $M_n$ between the gate and drain thereof, respectively. The gate of the FET $M_n$ is supplied directly with an input signal Vin and the gate of the FET $M_p$ is supplies with the input signal Vin through capacitor $C_1$ for AC coupling.

In the above-described complementary FET amplifier circuit the bias resistors $R_{F1}$ and $R_{F2}$ are connected between the gate and drain of the FET $M_p$ and between the gate and drain of the FET $M_n$, respectively, and the gates of these FETs are isolated in a D.C. sence from each other by capacitor $C_1$, so that the FETs are self-biased. Therefore, the above-described amplifier undergoes class B operation and, as the through current which is generated when both of the FETs Mn and Mp are simultaneously turned on is decreased, the power consumption of the amplifier circuit is conveniently reduced.

However, in order for the above-described amplifier to perform a correct amplification operation, the source voltage applied between the source terminals (this source voltage will be referred to as the "operating voltage" hereinafter) of the FETs Mn and Mp has to be greater than the sum of the threshold voltages $V_{THN}$ and $V_{THP}$ of two FETs Mn and Mp. This sum of the threshold voltages will be referred to as the "operational lower limit voltage" hereinafter. Therefore, if the power source voltage has decreased below the level of the operational lower limit voltage, the amplifier will fail to operate correctly. This becomes a serious problem, for example, when the amplifier is used in a battery-operated wrist watch.

Figure 2:
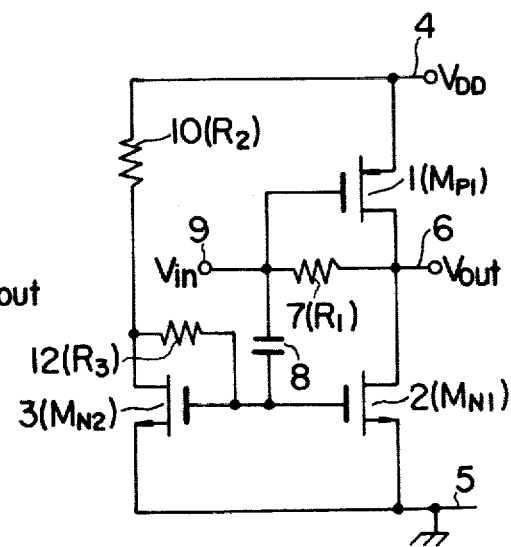
FIG. 2 is a schematic circuit diagram of a complementary amplifier circuit in accordance with this invention.

In the complementary amplifier circuit shown in FIG. 2, which shows a circuit diagram of one embodiment of a complementary amplifier circuit according to the invention, a p-channel MISFET 1 ($M_{P1}$) and an n-channel MISFET 2 ($M_{N1}$), which are complementary to each other, are connected in series between a source line 4 which provides a first source potential $V_{DD}$ and a grounding line 5 which provides a second source potential. An output voltage Vo is derived from the junction point 6 of the drain of these MISFETs 1 and 2. The gate and drain of the MISFET 1 are connected to each other through a self-bias resistor 7.

Broadly, metal insulator semiconductor field effect transistors (MISFETs) are classified into two types; that is, the thin-film transistor (TFT) and the metal oxide semiconductor (MOS). Since the MOS field effect transistors are more popular, the following description of various exemplary embodiments of this invention will be made with reference to the use of MOSFETs rather than TFTs, although both types may be used with the present invention. In order to simplify the description, the MOSFETs will be referred to simply as FETs hereinbelow.

The gate electrode of the FET 2 ($M_N$) is connected to the gate electrode of the FET 1 ($M_{P1}$) through a capacitor 8. Also, the input terminal 9 receives an A.C. input signal which is delivered directly to the gate electrode of the above-mentioned FET 1 ($M_{P1}$).

A resistor 10 ($R_2$) and the drain and source of an n-channel FET 3 ($M_{N2}$), which in combination constitute means for supplying electric current, are connected between the source line 4 and the grounding line 5. The gate and drain electrodes of the FET 3 ($M_{N2}$) are connected to each other through a resistor 12 ($R_2$), and the gate electrode thereof is connected also to the gate electrode of the FET 2 ($M_{N1}$).

In the above-described complementary amplifier circuit, the gate of the FET 1 ($M_{P1}$) is connected to the drain thereof through a bias resistor 7, the resistance of which is 10 to 100 MΩ. Therefore, the gate potential is set in a D.C. sense substantially at the same level as the threshold voltage $V_{THP}$ of the FET 1 ($M_{P1}$) to effect amplification of the negative part of the cycle of the input signal.

Also, the gate electrode of the FET 2 ($M_{N1}$) is connected to the gate electrode of the FET 3 ($M_{N2}$) of the mirror circuit which is constituted by resistors 10, 12 and FET 3. Therefore, the D.C. bias is set at the level of the threshold voltage $V_{THN}$ of the FET 2 to effect amplification of the positive part of the cycle of the input signal. The capacitor 8 functions to isolate the gate potentials of the FETs 1 and 2 in a D.C. sense. In the described embodiment, the gate and drain electrodes of the p-channel FET are connected to each other by means of the self-bias resistor 7, and the gate and drain of the n-channel FET 2 are isolated from each other. However, the gate and drain of the n-channel FET 3 ($M_{N2}$) are connected to each other by means of the resistor 12.

In the complementary amplifier circuit of the described embodiment, the source voltage $V_{DD}$ for simultaneously operating the FETs 1 and 2 has only to be higher than the higher one of the threshold voltage $V_{THP}$ of the p-channel FET 1 and the threshold voltage $V_{THN}$ of the n-channel MOSFET 2 ($M_{N2}$). Therefore, the amplifier can operate even after the source voltage $V_{DD}$ has decreased due to a secular change. Assuming here that the threshold voltage $V_{THP}$ and $V_{THN}$ are equal, the operational lower limit voltage is lowered substantially to half of that of the conventional complementary amplifier circuit in which the operational lower limit voltage is equal to the sum of the threshold voltages.

When the operational voltage is lowered, the potential at the gate of the FET 1 ($MP_1$) is decreased below the potential at the gate of the transistor 2, and the capacitor 8 is charged such that the potential is higher at its one side connected to the gate of the FET 2 than at the side thereof connected to the gate of the FET 1. In addition, according to the described embodiment, the level at which the FETs 1 and 2 are simultaneously conductive against an A.C. signal amplitude is minimized to reduce the power consumption. Further, stable operation of the amplifier is ensured even under a fluctuation of the characteristics of the constituent elements and fluctuation of the source voltage, because the bais voltage of the FET is set by self-biasing.

Figure 3:
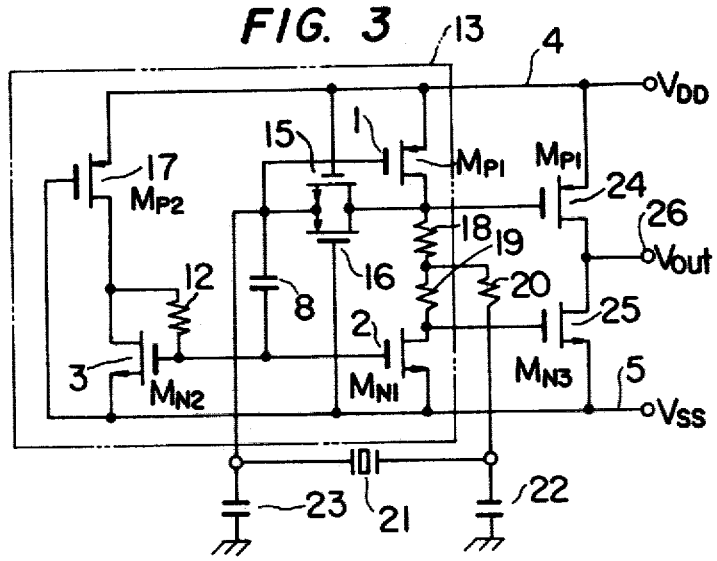
FIG. 3 is a schematic circuit diagram of an oscillation circuit for a wrist watch incorporating the complementary amplifier circuit of the present invention.

Thank to these features, the amplifier circuit of this invention is suitble particularly for a use which requires a high input impedance, e.g., an amplifier which is used in combination with the quartz oscillator of a wrist watch. FIG. 3 shows a circuit diagram of a circuit including the complementary amplifier of this invention incorporated in an oscillation circuit for a wrist watch. In this figure, the block 13 enclosed by broken lines is the circuit which is materially identical to the complementary amplifier circuit shown in FIG. 2. However, in order to minimize the installation space, a complementary FET 15 constituting a high resistance and a p-channel FET 17 as a resistance means are substituted for the self-bias resistor 7 and the load resistance 10, respectively. Similarly, a FET may be used in place of the bias resistance 12 ($R_3$) of the FET 3.

Resistors 18 and 19 connected in series between the drains of the MISFETs 1 and 2 cooperate with each other in limiting the through current flowing between the FETs 1 and 2, and also in making the bias voltage between the gate and source approach the threshold voltage to further reduce the power consumption.

A quartz oscillator 21 and input/output capacitors 22, 23 are connected between the gate of the FET 1, which is the input terminal of the amplifier, and the junction between the resistors 18, 19, through the medium of an output resistor 20, thereby to constitute a quartz oscillator circuit. The quartz oscillator circuit operates in a manner known per se, so that the detailed description thereof is omitted here. The drains of the FETs 1 and 2 are connected to respective gates of FETs 24 and 25 which constitute a wave shaping circuit composed of another complementary amplifier.

If the output voltage is applied to the junction between the resistors 18 and 19, the through current in the abovementioned wave shaping circuit becomes large to increase the power consumption. A rectangular wave form is obtained at the output terminal of the wave shaping circuit, if the output voltage derived from the drains of the FETs 1 and 2 is applied to the wave shaping circuit, because the latter has no load resistor therein. Therefore, the D.C. component of the signal applied between the source and gate of each of the FETs 24 and 25 is substantially equal to the threshold voltage, so that the period in which the FETs 24 and 25 are concurrently conductive is shortened to reduce the power consumption.

Although the invention has been described through a specific embodiment, the described embodiment is not exclusive and various changes and modifications may be made. For instance, the conductivities of the MOSFETs may be inversed subject to an inversion of the polarity of the source voltage.

While I have shown and described several embodiments in accordance with the present invention, it is to be understood that the same is not limited thereto but is susceptible of numerous changes and modifications as known to those of ordinary skill in the art, and I therefore do not wish to be limited to the details shown and described herein but intend to cover all such changes and modifications as obvious to those skilled in the art.

What is claimed is:

1. A complementary amplifier circuit comprising: first and second potential sources; a first FET of a first conductivity having a gate connected to an input terminal, a source connected to said first potential source and a drain; a second FET of a second conductivity type having a gate, a source connected to said second potential source and a drain; first connecting means connected between the drains of said first and said second FETs; bias resistive means connected between the gate and the drain of said first FET; a capacitor connected between the gates of said first and second FETs; a third FET of said second conductivity type having a gate connected to the gate of said second FET, a source connected to the source of said second FET and a drain; second connecting means connected between the drain and the gate of said third FET; and load means connected between said first potential source and the drain of the third FET.

2. A complementary amplifier circuit according to claim 1, wherein said second connecting means is a resistor.

3. A complementary amplifier circuit according to claim 1, wherein said load means is a resistor.

4. A complementary amplifier circuit according to claim 1, wherein, said load means is a fourth FET of said first conductivity type having a gate, a source and a drain are connected to said second potential source, said first potential source and the drain of the third FET, respectively.

5. A complementary amplifier circuit according to claim 1, wherein said bias resistive means is constructed by complementary FETs of which the sources and the drains are commonly connected.

6. A complementary amplifier circuit according to claim 1, wherein said first connecting means includes a resistor.

7. A complementary amplifier circuit according to claim 1, wherein said first connecting means is two resistors connected in series between the drains of said first and second FETs, and further comprises a positive feedback circuit connected between the connecting point of said two resistors and the gate of said first FET and including a crystal oscillator.

8. A complementary amplifier circuit according to claims 1 or 7, further comprising a wave shaping circuit including a fourth FET of a first conductivity type, and a fifth FET of a second conductivity type complementary connected in series, the gates of said fourth and fifth FETs being connected to the drains of said first and second FETs, respectively.

* * * * *